(12) United States Patent
Dastidar

(10) Patent No.: US 7,707,472 B1
(45) Date of Patent: Apr. 27, 2010

(54) METHOD AND APPARATUS FOR ROUTING EFFICIENT BUILT-IN SELF TEST FOR ON-CHIP CIRCUIT BLOCKS

(75) Inventor: Jayabrata Ghosh Dastidar, San Jose, CA (US)

(73) Assignee: Altera Corporation, San Jose, CA (US)

(*) Notice: Subject to any disclaimer, the term of this patent is extended or adjusted under 35 U.S.C. 154(b) by 648 days.

(21) Appl. No.: 10/848,342

(22) Filed: May 17, 2004

(51) Int. Cl.
*G01R 31/28* (2006.01)
*G11C 29/00* (2006.01)

(52) U.S. Cl. .................. 714/733; 714/718; 714/726; 714/727; 714/729; 714/734

(58) Field of Classification Search .................. None
See application file for complete search history.

(56) References Cited

U.S. PATENT DOCUMENTS

| | | | |
|---|---|---|---|
| 3,829,842 A | | 8/1974 | Langdon et al. |
| 3,961,252 A | * | 6/1976 | Eichelberger ............... 714/720 |
| 4,439,764 A | | 3/1984 | York et al. |
| 4,609,838 A | | 9/1986 | Huang |
| 4,812,627 A | | 3/1989 | Wexler et al. |
| 4,852,073 A | | 7/1989 | Shinohara et al. |
| 4,967,155 A | | 10/1990 | Magnuson |
| 5,041,964 A | | 8/1991 | Cole et al. |
| 5,105,425 A | | 4/1992 | Brewer |
| 5,185,744 A | * | 2/1993 | Arimoto et al. ............. 714/719 |
| 5,526,278 A | | 6/1996 | Powell |
| 5,526,678 A | | 6/1996 | Shaw et al. |
| 5,579,322 A | * | 11/1996 | Onodera ..................... 714/730 |
| 5,610,925 A | * | 3/1997 | Takahashi .................. 714/724 |
| 5,754,758 A | * | 5/1998 | Baeg et al. .................. 714/30 |
| 5,784,382 A | * | 7/1998 | Byers et al. ................. 714/726 |
| 5,844,917 A | * | 12/1998 | Salem et al. ................ 714/724 |
| 5,936,868 A | | 8/1999 | Hall |
| 5,968,192 A | * | 10/1999 | Kornachuk et al. ......... 714/724 |
| 6,029,261 A | * | 2/2000 | Hartmann ................... 714/724 |
| 6,044,481 A | * | 3/2000 | Kornachuk et al. ......... 714/724 |
| 6,065,134 A | | 5/2000 | Bair et al. |
| 6,066,960 A | | 5/2000 | Pedersen |
| 6,154,837 A | | 11/2000 | Fudeyasu et al. |
| 6,233,191 B1 | | 5/2001 | Gould et al. |
| 6,249,143 B1 | | 6/2001 | Zaveri et al. |

(Continued)

OTHER PUBLICATIONS

"FLEX 10K Embedded Programmable Logic Family," product data sheet version 1 from Altera Corporation San Jose, CA (Jul. 1995).

(Continued)

*Primary Examiner*—Cynthia Britt
*Assistant Examiner*—Guerrier Merant
(74) *Attorney, Agent, or Firm*—Townsend and Townsend and Crew LLP

(57) ABSTRACT

Built-in self test techniques for testing circuit blocks on integrated circuits are provided. A BIST controller is provided on-chip to test two or more circuit blocks. High routing congestion is avoided by loading test data into the circuit blocks through scan chain segments that run continuously along the inputs and outputs of the circuit blocks. The BIST controller takes control of the scan chain segments during test and has the ability to partition the scan chains at specified intervals.

16 Claims, 3 Drawing Sheets

U.S. PATENT DOCUMENTS

| | | | |
|---|---|---|---|
| 6,271,019 B1* | 8/2001 | Van Baren et al. ...... 435/252.33 |
| 6,321,320 B1* | 11/2001 | Fleischman et al. ......... 711/217 |
| 6,360,342 B1* | 3/2002 | Lee et al. .................... 714/718 |
| 6,370,664 B1* | 4/2002 | Bhawmik ................... 714/729 |
| 6,492,833 B1 | 12/2002 | Asson et al. |
| 6,636,998 B1* | 10/2003 | Lee et al. .................... 714/735 |
| 6,643,804 B1* | 11/2003 | Aipperspach et al. ....... 714/718 |
| 6,668,347 B1* | 12/2003 | Babella et al. .............. 714/733 |
| 6,744,274 B1* | 6/2004 | Arnold et al. ................. 326/16 |
| 6,807,645 B2* | 10/2004 | Angelotti et al. ............ 714/732 |
| 6,961,886 B2* | 11/2005 | Motika et al. ............... 714/732 |
| 6,964,001 B2* | 11/2005 | Dervisoglu et al. ......... 714/726 |
| 6,968,487 B1* | 11/2005 | Bryant et al. ............... 714/726 |
| 6,971,054 B2* | 11/2005 | Kurtulik et al. ............ 714/732 |
| 7,155,370 B2* | 12/2006 | Nejedlo ...................... 702/186 |
| 7,171,600 B2* | 1/2007 | Takeoka et al. ............. 714/727 |
| 2002/0131307 A1* | 9/2002 | Murai et al. ................ 365/200 |
| 2002/0138801 A1* | 9/2002 | Wang et al. ................. 714/729 |
| 2002/0184583 A1* | 12/2002 | Hikone et al. .............. 714/726 |
| 2003/0149927 A1* | 8/2003 | Wang ......................... 714/738 |
| 2004/0098643 A1* | 5/2004 | Schulz ....................... 714/718 |
| 2004/0210808 A1* | 10/2004 | Motika et al. ............... 714/726 |
| 2005/0076268 A1* | 4/2005 | Martinez ...................... 714/42 |
| 2005/0080581 A1* | 4/2005 | Zimmerman et al. ........ 702/117 |
| 2005/0120284 A1* | 6/2005 | Ouellette et al. ............ 714/718 |
| 2005/0193274 A1* | 9/2005 | Aoki et al. .................... 714/42 |

OTHER PUBLICATIONS

"Implementing RAM Functions in FLEX 10K Devices," application note 52 version 1 from Altera Corporation San Jose, CA (Nov. 1995).

"Implementing FIFO Buffers in FLEX 10K Devices," application note 66 version 1 from Altera Corporation San Jose. CA (Jan. 1996).

"FLEX 8000 Programmable Logic Device Family," product data sheet version 8 from Altera Corporation San Jose, CA (Jun. 1996).

"Embedded Deterministic Test(EDT™)—DFT Technology for High-Quality Low-Cost Manufacturing Test," technical publication from Mentor Graphics Corporation Wilsonville, Oregon (Feb. 2003).

"Testing large Capacity CAM with MBISTArchitect and Fastscan Macrotest," technical publication from Mentor Graphics Corporation Wilsonville, Oregon (Aug. 2001).

* cited by examiner

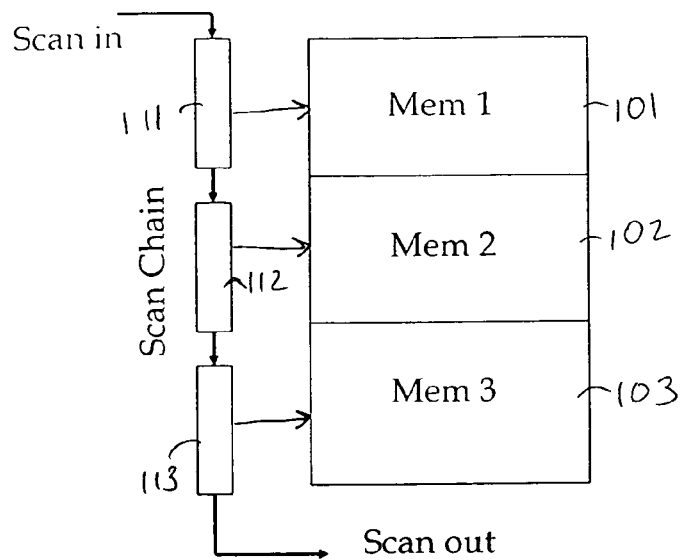
Figure 1. Memory Input Registers Tied in a Continuous Scan Chain
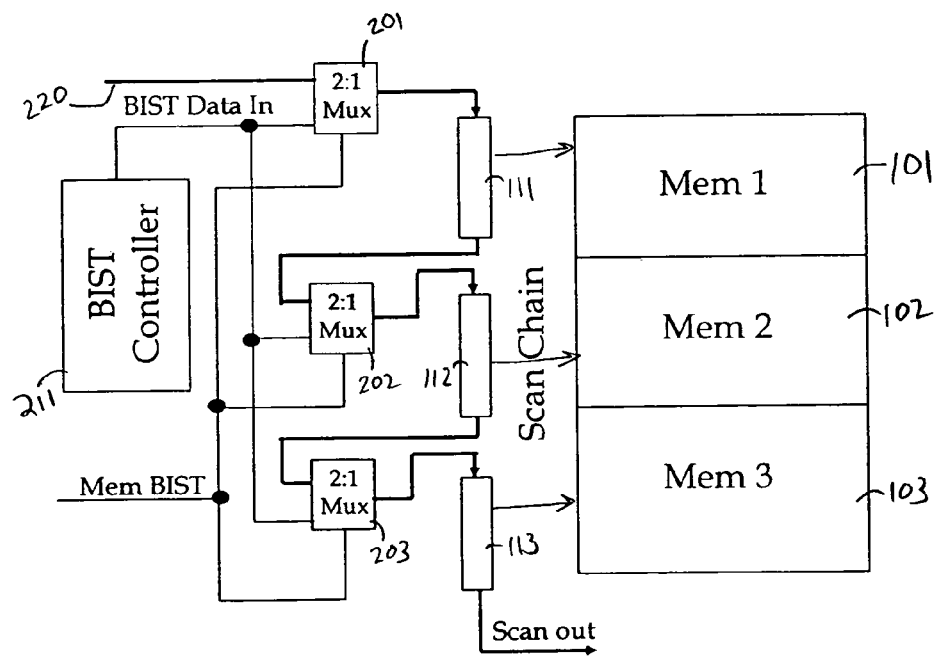
Figure 2. Scan Chain with the Memory BIST Controller

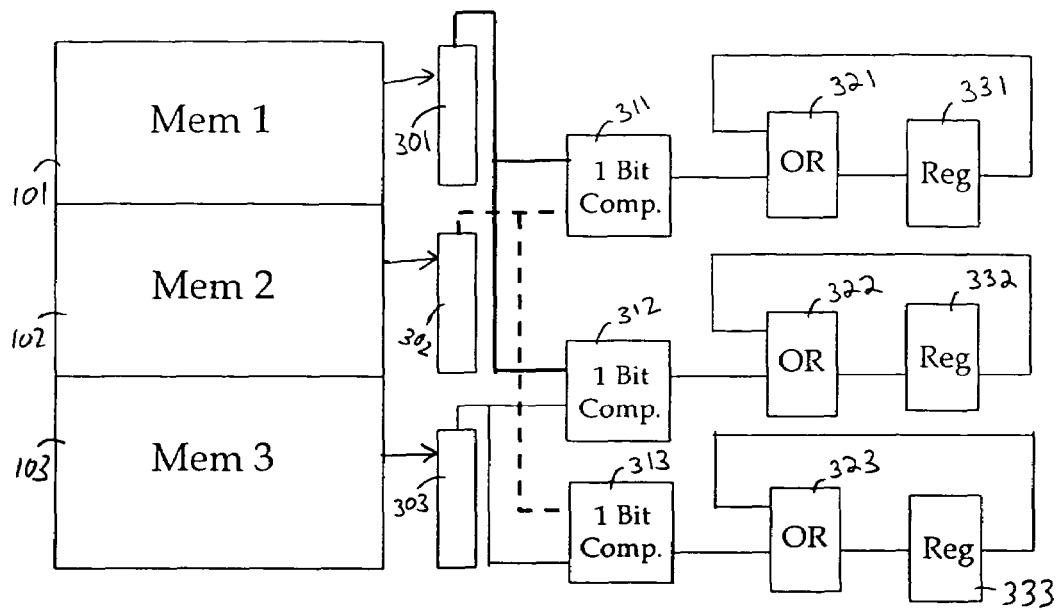
Figure 3. Output Data Compression Strategy
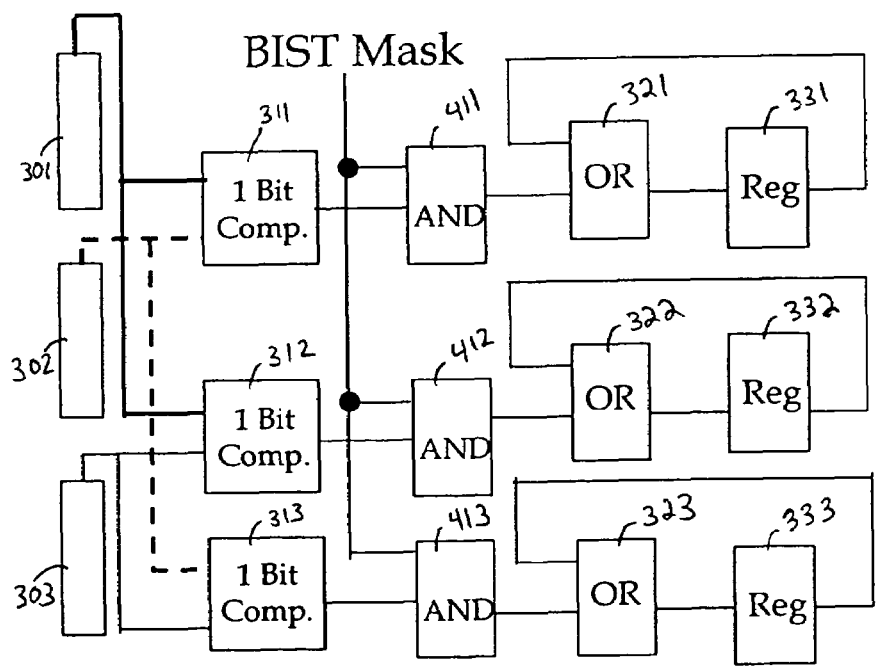
Figure 4. Masking the Comparator Outputs

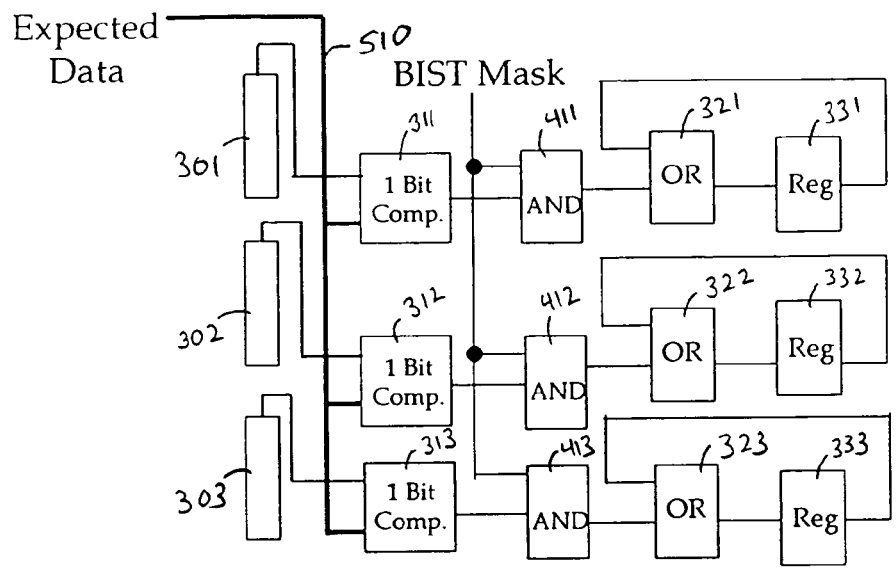
Figure 5. Expected Data Routed from BIST Engine
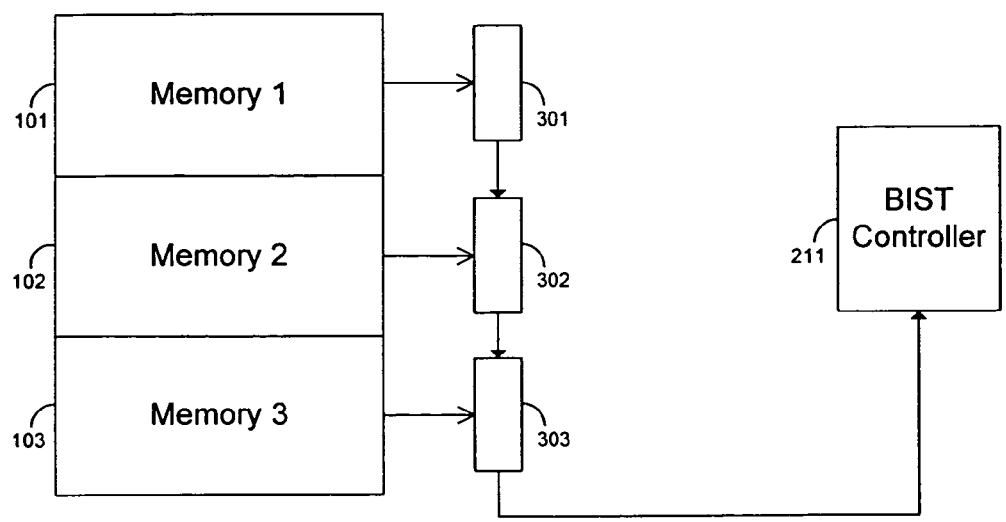
Figure 6

METHOD AND APPARATUS FOR ROUTING EFFICIENT BUILT-IN SELF TEST FOR ON-CHIP CIRCUIT BLOCKS

BACKGROUND OF THE INVENTION

The present invention relates to built-in self tests for on-chip circuit blocks, and more particularly, to configurations for built-in self tests for on-chip circuit blocks that reduce routing and die area.

Programmable logic devices (PLDs) are integrated circuits that can be configured to perform a variety of user functions. PLDs typically have numerous logic blocks that can be configured to implement various combinatorial and sequential functions. The logic blocks have access to a programmable interconnect structure. The programmable interconnect structure can be programmed to interconnect the logic blocks in almost any desired configuration.

PLDs usually have on-chip memory blocks. Each of the memory blocks contains an array of memory cells. The memory cells can be, for example, SRAM, DRAM, EPROM, EEPROM, or Flash EEPROM cells. The memory blocks are dispersed throughout the chip in between the logic blocks.

After a PLD is manufactured, the memory cells in the memory blocks must be tested to ensure that they are operating properly. In recent years, the number of memory cells in PLD chips has grown considerably. As the number of on-chip memory blocks in PLDs increases, it becomes increasingly difficult to test the memory blocks in a cost effective manner.

Usually on-chip memory is tested using build-in self test (BIST) controllers. BIST is a preferred technique for memory blocks that have a large number of memory cells. PLDs often have a huge number of small memory blocks that have 512 bits to 64K bits each. As a result, it is not cost effective to have separate on-chip BIST controllers for each memory block.

Another option is to place one BIST controller on the PLD and route test signals from the single BIST controller directly to all of the memory blocks. However, this techniques places a large demand on the PLD's interconnect structure. The same set of signals has to be routed to numerous on-chip memory blocks from one BIST controller along dedicated routing wires.

Another option is to program soft BIST controllers in programmable logic on a PLD. The BIST controllers are used for testing the memory blocks and then erased after testing is completed. There is no hardware overhead, and the existing programmable routing structure is programmed to route signals from the BIST controller to the memory blocks.

Once a particular design for a PLD has been successfully implemented and tested, the design may not need to be changed again. At that point, it may be desirable to reduce production costs by implementing the design in a lower cost mask-programmable PLD (MPLD). Altera's Hardcopy device is an example of a MPLD.

An MPLD is a device that is configured or "hard-wired" during the fabrication of the device. For example, the PLD manufacturer fabricates a MPLD design by using a specific mask corresponding to a user's design. The specific mask is chosen so that logic blocks and the interconnect structure are pre-programmed to perform the design.

Soft BIST controllers cannot be programmed into MPLDs to test on-chip memory blocks, because the functionality of the on-chip logic is fixed during manufacture. Therefore, additional hardware is required to implement BIST for memory blocks in MPLDs.

It is generally more efficient to have a dedicated BIST controller for a large memory block, because the relative hardware overhead is small. However, it is very expensive in terms of tester time and memory to run all the memory vectors from the tester. Also, getting enough pins to access all the memory blocks may be difficult to come by.

It is not cost effective to have an individual BIST controller for every memory block on an integrated circuit (IC) that has a large number of small memory blocks. On other hand, using one BIST controller that routes test signals directly it to hundreds of memory blocks all over an IC along dedicated routing wires causes routing congestion.

Therefore, it would be desirable to provide techniques for testing memory blocks and other circuit blocks on MPLDs and ASICs that minimize the amount of on-chip circuitry and dedicated routing resources needed to implement the tests.

BRIEF SUMMARY OF THE INVENTION

The present invention includes built-in self test techniques for testing on-chip circuit blocks (e.g., memory blocks) on integrated circuits. A reduced number of BIST controllers are provided on-chip to test numerous circuit blocks. The present invention avoids the high routing congestion by utilizing scan chain segments that run continuously along the inputs and outputs of the circuit blocks. The BIST controller takes control of the scan chains during memory test and has the ability to partition the scan chains at specified intervals.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 illustrates input scan chain registers associated with three memory blocks.

FIG. 2 illustrates a BIST controller coupled to input scan chain registers through multiplexers according to an embodiment of the present invention.

FIG. 3 illustrates a data compression circuit that is used to test memory blocks on an integrated circuit according to an embodiment of the present invention.

FIG. 4 illustrates circuitry that uses a BIST mask signal to block the test output signals of one or more memory blocks according to an embodiment of the present invention.

FIG. 5 illustrates circuitry that compares test data to expected data in order to test memory blocks on an integrated circuit according to an embodiment of the present invention.

FIG. 6 illustrates circuitry that serially shifts test output data from memory blocks to a BIST controller according to an embodiment of the present invention.

DETAILED DESCRIPTION OF THE INVENTION

The techniques of the present invention can be used to test circuits blocks on an integrated circuit such as a mask programmable logic device (MPLD) or an application specification integrated circuit (ASIC). Memory blocks are one example of circuit blocks that can be tested according to the techniques of the present invention. The present invention can also be used to test other types of circuit blocks such as digital signal processing (DPS) blocks.

FIG. 1 shows a typical example of three contiguous memory blocks 101, 102, and 103 on an integrated circuit (IC). A memory block on a MPLD or other type of IC typically has input and output registers that are used to store data bits transferred to and from the memory block.

Memory blocks 101-103 receive data from input registers 111, 112, and 113, respectively. Input registers 111-113 can be serially coupled together as scan chain segments of shift registers as shown in FIG. 1. Alternatively, shadow registers can be placed on the IC at the inputs and outputs of the memory blocks, if the memory blocks do not have input/output registers.

A built-in self test (BIST) of the present invention uses the input scan chain segments 111-113 to test memory cells in memory blocks 101-103. According to the present invention, test values and memory address signals are scanned into the scan chain segments 111-113 during a test procedure. After the test is performed, the test values are scanned out from scan chain segments 111-113. By using existing scan chain segments 111-113, the present invention reduces the amount of overhead circuit components that need to be added on-chip to implement a BIST of a circuit block.

FIG. 2 illustrates a built-in self test controller 211 that is used to test memory cells in memory blocks 101-103. BIST controller 211 takes over the operation of scan chain segments 111-113 during a built-in self test. A Mem BIST signal controls routing multiplexers 201, 202, and 203. The Mem BIST signal can be generated by controller 211, or by other on-chip circuitry, or from an external source.

The circuitry of FIG. 2 operates in serial mode when the Mem BIST signal is in a first logic state. In serial mode, multiplexer 201 couples the output of BIST controller 211 to scan chain segment 111, multiplexer 202 couples scan chain segment 111 to scan chain segment 112, and multiplexer 203 couples scan chain segment 112 to scan chain segment 113. Thus, scan chain segments 111-113 are coupled together in a serial scan chain. BIST data is serially shifted from controller 211 through scan chain segments 111-113.

BIST controller 211 can also drive the scan chain registers in parallel at selected points as shown in FIG. 2. The circuitry of FIG. 2 operates in parallel mode when the Mem BIST signal is in a second logic state. In parallel mode, multiplexer 201 couples input 220 to scan chain segment 111, multiplexer 202 couples the output of BIST controller 211 to scan chain segment 112, and multiplexer 203 couples the output of BIST controller 211 to scan chain segment 113. BIST data from controller 211 is loaded in parallel into scan chain segments 112 and 113. BIST data from another source (e.g., a microprocessor) is loaded into scan chain segment 111 from input 220. Alternatively, BIST data is loaded into scan chain segment 111 from BIST controller 211 in parallel mode.

Scan chain segments 111-113 are preferably partitioned at the end of each memory block in parallel mode, as previously described. However, it is not necessary to partition at every memory block boundary. Partitioning could be performed after every two or more memory blocks. A tradeoff occurs between test time and the number of partitions on the scan chain input registers. Making the partition after every memory block allows BIST controller 211 to be simplified.

The circuitry of FIG. 2 can be used to test all of memory blocks 101-103 in parallel without the overhead of individual BIST controllers for each memory block. Also, FIG. 2 reduces the routing congestion associated with routing one BIST controller to multiple memory blocks, because the scan chain segments 111-113 and some existing routing resources are used to route test signals from BIST controller 211 to memory blocks 101-103.

In the embodiments of FIGS. 1-2, one BIST controller 211 routes test data to three memory blocks 101-103. According to further embodiments of the present invention, a single BIST controller routes test data to two or more memory blocks (e.g., to two memory blocks, four memory blocks, five memory blocks, six memory blocks, etc.).

Generally, at least one routing line per memory block is needed. Depending on how many memory blocks there are on-chip and how the memory blocks are distributed, it may be more cost effective from a routing standpoint to have multiple BIST controllers spread across the chip. The constraint with this technique is that all memory blocks have to be configured identically for test. But because the BIST controllers can be run relatively fast, and there is no need for storing and applying vectors from a tester, all of the memory blocks can be tested in all possible configurations. In order to test all possible configurations, the capability to configure the memory blocks into different modes in Test mode is needed. That capability is an over kill for an MPLD, because every memory block has a particular configuration.

An alternative is to test all the memory blocks in a particular configuration and then use an automatic test program generator (ATPG) to generate test vectors for the interface logic that remains untested. An ATPG typically generates stuck-at 1 or stuck-at 0 fault patterns and delay fault patterns. This technique adds an extra step in the flow. If all the configuration logic is removed in an MPLD and only the test mode with user mode is provided, then the amount of logic missed due to test mode testing is small and can be ignored.

Once the BIST data has been shifted into scan chain segments 111-113, the BIST data is loaded into memory cells within memory blocks 101-103. Each memory cell is supposed to function as an independent storage location. If a memory cell does not store data independently from neighboring memory cells, it is a faulty cell.

The built-in self test can be performed in any desired format. For example, a BIST controller can cycle through all of the memory addresses in different orders and create different combinations of memory test patterns. Test bits can be stored at the randomly generated memory addresses in the memory blocks. The BIST data is altered if the memory cells contain any defects. The BIST data is then loaded out of memory blocks 101-103 into output scan chain segments 301, 302, and 303, respectively, that are shown in FIG. 3.

The observation of the output BIST patterns will now be discussed in detail. FIG. 3 shows an example of an embodiment of the present invention that analyzes output BIST patterns. Memory blocks 101-103 output data to output registers 301, 302, and 303, respectively. Output registers 301-303 can be serially coupled together as scan chain segments of shift registers.

Three memory blocks 101-103 are used for the comparisons in the embodiment of FIG. 3 merely as an example. Any number of memory blocks and a corresponding number of output registers, comparators, OR gates, and registers can be used to analyze output BIST data.

The output of scan chain segment 301 is coupled to inputs of comparators 311 and 312. The output of scan chain segment 302 is coupled to inputs of comparators 311 and 313. The output of scan chain segment 303 is coupled to inputs of comparators 312 and 313. The outputs of comparators 311-313 are coupled to first inputs of OR gates 321-323, respectively. The outputs of OR gates 321-323 are coupled to inputs of registers 331-333, respectively. The outputs of registers 331-333 are coupled to second inputs of OR gates 321-323, respectively.

In the embodiment of FIG. 3, the output scan chain is split up at the boundaries of memory blocks 101-103. The connection required to restore the original scan chain is not shown in FIG. 3. Test values from scan chains segments 301-303 are clocked out and compared against each other by 1-bit comparators 311-313.

The circuitry shown in FIG. 3 is repeated for every 3 memory blocks in the integrated circuit. Scan chain segments 301-303 are initialized to zero at the start of a BIST. Scan chain segments 301-303 have a scan enable terminal (not shown) that is guarded by the Mem BIST signal, so that the registers do not scan during the BIST operation.

After each BIST cycle, the test data is loaded from memory blocks 101-103 to output scan chain segments 301-303, respectively. Each of comparators 311-313 compares test data from two of output scan chain segments 301-303. OR gates 321-323 receive the output signals of comparators 311-313, respectively. The output signals of OR gates 321-323 are stored in registers 331-333, respectively. OR gates 321-323 perform a logical OR function on the output signals of comparators 311-313 and the signals stored in registers 331-333, respectively.

If there is any mismatch between test values received from any two of memory blocks 101-103, the output signal of one of comparators 311-313 is a logic one. The logic one is latched on one of registers 331-333. Registers 331-333 can store their latched values for as long as needed. The values latched in registers 331-333 are scanned out at the end of the BIST.

The embodiment of FIG. 3 only fails to detect common mode failure if a failure occurs at all three memory blocks 101-103. But such failures are most likely to be the result of mask defects. Mask defects can be eliminated by testing any one memory block individually using the original scan chains.

FIG. 4 illustrates another embodiment of the present invention that analyzes output BIST patterns. FIG. 4 adds masking capability that is used for testing the memory blocks in different configurations. BIST controller 211 generates a BIST Mask signals that can be used to ignore output signals of comparators 311-313. BIST controller 211 sets the BIST Mask signals at zero volts to ignore the comparator output signals. AND gates 411-413 block the output signals of comparators 311-313 in response to receiving a zero valued BIST Mask signal at its input.

The BIST mask signal can be used for a variety of purposes. For example, the BIST mask signal can prevent undesired values from being latched into registers 331-333 during initialization of the IC. As another example, the BIST mask signal can be used to freeze the output chain when the input scan chain and output scan chain are of different lengths.

For the embodiment of FIG. 4, the circuit overhead per memory block includes one comparator, one AND gate, one OR gate, and one Register. The memory block that failed during test can be identified by analyzing the contents of registers 331-333 after the test. The comparison logic has been placed at the output of the memory block to simplify routing.

The embodiments of the present invention can also be used to test other types of on-chip circuit blocks such as multiplier completer (MAC) blocks. Several MAC blocks can be tested using the same BIST controller in the manner shown in the Figures.

If all three memory blocks 101-103 have defects that cause the same exact errors in the output test data, it will not be possible to use the embodiments of FIGS. 3-4 to identify an error in the output data.

The circuitry of FIG. 5 eliminates the issue of common mode failure between the memory blocks. In this embodiment, BIST controller 211 (or some other source) generates the test data that is expected to be output by memory blocks 101-103 if they contain no defects. This test data is referred to as the expected data.

In FIG. 5, the expected data is routed to inputs of comparators 311-313. Three long distance routing wires 510 are used on-chip to route three expected data signals from controller 211 to the three comparators 311-313. Comparators 311-313 compare the test output data from scan chain segments 301-303, respectively, to the expected data signals.

The embodiment of FIG. 5 eliminates the concern with grouping the memory blocks into groups for comparison purposes. By comparing output test data from each memory block with corresponding expected data, errors can be identified in test output data from one memory block, two memory blocks, or all 3 memory blocks.

Four sets of global signals are used in the embodiment of FIG. 5. This represents a huge reduction from the address and data bus routing needed for driving the memory blocks directly from the BIST controller. The signals required are the Mem BIST control signals, the BIST Mask signals, the Expected Data signals, and the BIST Data In signals.

The BIST embodiments of the present invention typically require more test cycles than prior art techniques (depending on the width of the memory), because data is serially fed into the scan chain registers. However, the test time is not increased significantly, because the BIST controller is run on-chip at a relatively fast frequency (e.g., 50 MHz).

The embodiment shown in FIG. 5 can also be used for testing on chip circuit blocks in PLDs with or without redundancy. However, this embodiment has certain advantages when used for PLDs with redundancy. Often chip circuit blocks, such as the ones discussed herein, are part of a repairable unit in the PLD. Associating comparator and error storage logic with each circuit block under test allows latching of any error value during test, retrieving such information from registers 331-333, and deciding which PLD repairable unit to repair after test.

FIG. 6 illustrates another embodiment of the present invention that can be used if the IC design is not repairable. In FIG. 6, output registers 301-303 are serially coupled together as scan chain segments of shift registers. The embodiment of FIG. 6 saves die area by eliminating all of the separate comparators and storage logic shown in FIG. 5. Instead, the test output data of memory blocks 101-103 are stored in scan chain segments 301-303, respectively, and then serially shifted out to BIST controller 211 for comparison (e.g., to expected data).

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for testing a plurality of on-chip memory blocks on an integrated circuit, the method comprising:

configuring a plurality of data selection circuits with a control signal, wherein a first state of the control signal configures the plurality of data selection circuits for transferring built-in self test (BIST) data and address values from a single BIST controller serially to input scan chain segments associated with a plurality of on-chip memory blocks;

wherein a second state of the control signal configures the plurality of data selection circuits for transferring the BIST data and the address values from the single BIST controller in parallel to the input scan chain segments associated with the plurality of on-chip memory blocks;

loading the BIST data from the input scan chain segments into memory cells in the plurality of on-chip memory blocks;

reading output BIST data from the memory cells;

loading the output BIST data read from the memory cells into output scan chain segments associated with the plurality of on-chip memory blocks;

transferring the output BIST data from the output scan chain segments to comparators;

performing OR logic functions on the output signals of the comparators and output signals of registers using logic gates; and transferring output signals of the logic gates to inputs of the registers.

2. The method as defined in claim 1 wherein the integrated circuit is a mask programmable logic device.

3. The method as defined in claim 1 wherein the integrated circuit is an application specific integrated circuit.

4. The method as defined in claim 1 further comprising:
comparing the output BIST data to expected data using a set of comparators coupled to the output scan chain segments.

5. The method as defined in claim 1 further comprising:
comparing a first bit of the output BIST data to a second bit of the output BIST data using a first comparator; and
comparing the first bit of the output BIST data to a third bit of the output BIST data using a second comparator.

6. The method as defined in claim 1 further comprising:
transferring the output BIST data from the output scan chain segments to comparators;
generating a BIST mask signal; and
blocking output signals of the comparators in response to the BIST mask signal using logic gates.

7. The method as defined in claim 1 wherein the data selection circuits comprise multiplexers.

8. The method as defined in claim 1, wherein loading the BIST data from the input scan chain segments into the memory cells uses the address values.

9. The method as defined in claim 1, wherein the input scan chain segments are the output scan chain segments.

10. An integrated circuit comprising a system for testing multiple on-chip circuit blocks, the integrated circuit comprising:
a built-in self-test (BIST) controller that generates input BIST data;
a plurality of circuit blocks;
input scan chain segments associated with the plurality of circuit blocks that receive input BIST data from the BIST controller and load the input BIST data into the circuit blocks;
output scan chain segments associated with the plurality of circuit blocks that receive output BIST data read from the plurality of circuit blocks;
a plurality of comparators, each having a first input coupled to an output of an output scan chain segment and a second input coupled to receive expected data;
a plurality of OR gates coupled to receive output signals of the comparators; and
a plurality of registers coupled between outputs and inputs of the OR gates.

11. The integrated circuit defined in claim 10 further comprising:
a plurality of multiplexers coupled between outputs of the BIST controller and inputs of the input scan chain segments.

12. The integrated circuit defined in claim 10 further comprising:
a plurality of AND gates that are coupled to outputs of the comparators, wherein the plurality of OR gates are coupled to outputs of the AND gates, and wherein the plurality of registers are coupled between outputs and inputs of the OR gates.

13. The integrated circuit defined in claim 10 wherein the output scan chain segments are coupled together in serial to an input of the BIST controller.

14. The integrated circuit defined in claim 10 further comprising:
a plurality of multiplexers coupled between the input scan chain segments so that test data can be serially shifted into the input scan chain segments.

15. The integrated circuit defined in claim 10 wherein the integrated circuit is a mask programmable logic device, and wherein the input scan chains are operable to test additional circuit blocks on the integrated circuit.

16. The integrated circuit defined in claim 10 wherein the plurality of circuit blocks are memory blocks.

* * * * *